(12) United States Patent
Hatchard et al.

(10) Patent No.: US 6,181,017 B1
(45) Date of Patent: Jan. 30, 2001

(54) SYSTEM FOR MARKING ELECTROPHORETIC DIES WHILE REDUCING DAMAGE DUE TO ELECTROSTATIC DISCHARGE

(75) Inventors: Colin Hatchard, Campbell; Richard C. Blish, II, Saratoga; Daniel Yim, Fremont, all of CA (US)

(73) Assignee: Advanced Micro Devices, Inc., Sunnyvale, CA (US)

(*) Notice: Under 35 U.S.C. 154(b), the term of this patent shall be extended for 0 days.

(21) Appl. No.: 09/292,769

(22) Filed: Apr. 14, 1999

(51) Int. Cl.[7] .................................................. H01L 23/544
(52) U.S. Cl. ............................ 257/797; 257/48; 257/788; 257/790
(58) Field of Search ........................... 257/797, 798, 257/788, 790, 48; 438/401, 462, 975, 15, 25, 51, 55, 106, 126, 127

(56) References Cited

U.S. PATENT DOCUMENTS 5,688,573  *  11/1995  Goeb et al. ........................... 428/40.1

FOREIGN PATENT DOCUMENTS 3-093239  *  4/1991  (JP) .
3293063      12/1991  (JP) .

* cited by examiner

*Primary Examiner*—Donald L. Monin, Jr.
*Assistant Examiner*—Hoai Pham
(74) *Attorney, Agent, or Firm*—Sawyer Law Group LLP

(57) ABSTRACT

A system and method for marking a chip-scale package is disclosed. In one aspect, the chip-scale package includes a semiconductor die. The semiconductor die has an exposed portion substantially surrounded by the first coating. In this aspect, the method and system include applying a second coating to a first portion of the first coating and marking the second coating. The first coating is not completely penetrated by the marking. In a second aspect, the method and system include providing a chip-scale package. In this aspect, the method and system comprise providing a substrate, providing a semiconductor die coupled to a substrate, and providing a first coating. The semiconductor die has an exposed portion. The exposed portion is substantially surrounded by the first coating. In this aspect, the method and system further include providing a second coating substantially covering a first portion of the first coating. The second coating has a plurality of markings therein. The first coating is not completely penetrated by the plurality of markings.

13 Claims, 4 Drawing Sheets

SYSTEM FOR MARKING ELECTROPHORETIC DIES WHILE REDUCING DAMAGE DUE TO ELECTROSTATIC DISCHARGE

FIELD OF THE INVENTION

The present invention relates to chip scale packages and more particularly to a method and system for marking the chip scale package.

BACKGROUND OF THE INVENTION

Chip-scale packages are used in a variety of semiconductor applications. Chip-scale packages typically include a semiconductor die, or chip, mounted on a substrate. The active area of the semiconductor die includes the circuitry used to perform the desired functions. As their name suggests, chip-scale packages are on the order of the size of a semiconductor die contained within the package.

In order to designate the manufacturer, part type, and other information, the chip-scale packages are typically marked. Because of the amount of information carried in the marking and the size of a chip-scale package, the characters used in the mark are typically relatively fine. Typically, a laser is used to cut into a portion of the silicon on the exposed portion of the die. Thus, a user is able to read information on the chip-scale package relating to the manufacturer, the part type, and other information relating to the device.

One problem with chip-scale devices is damage due to electrostatic charging. When contact is made to the chip-scale package, the electrostatically induced charge may cause a spark. The spark may pass through a substantial portion of the semiconductor die, damaging the active area of the semiconductor die and causing failures in the chip-scale package.

Recently, a mechanism for reducing the damage induced by electrostatic sparking has been discovered. A nonconductive coating, such as an electrophoretic coating, is applied to the semiconductor die of the chip-scale package. In order to maintain the small size of the chip-scale package, the coating is applied in a thin layer. With the exception of the surface of the die which will contact the substrate, the coating substantially covers the semiconductor die. Once the semiconductor die is attached to the substrate, the chip-scale package has a reduced tendency to spark due to electrostatic charging. Thus, the failures due to sparking are reduced.

Although failures are reduced, conventional methods of marking of the chip-scale package are problematic. Conventional laser marking may destroy portions of the coating. As a result, benefits due to the coating will be lost. Even in an uncoated chip-scale package, laser marking may damage the active area, causing failures in the device. Failures may be caused in the chip-scale package for similar reasons if a conventional method for marking the chip-scale package is used.

Accordingly, what is needed is a system and method for marking a chip-scale package having a thin nonconductive coating. The present invention addresses such a need.

SUMMARY OF THE INVENTION

The present invention provides a method and system for marking a chip-scale package. In one aspect, the chip-scale package includes a semiconductor die coupled to a substrate and a first coating. The semiconductor die has an exposed portion substantially surrounded by a first coating. In this aspect, the method and system comprise applying a second coating to a first portion of the first coating and marking the second coating. The first coating is not completely penetrated by the marking. In a second aspect, the method and system comprise providing a chip-scale package. In this aspect, the method and system comprise providing a substrate, providing a semiconductor die coupled to a substrate, and providing a first coating. The semiconductor die has an exposed portion. The exposed portion is substantially surrounded by the first coating. In this aspect, the method and system further comprise providing a second coating substantially covering a first portion of the first coating. The second coating has a plurality of markings therein. The first coating is not completely penetrated by the plurality of markings.

According to the system and method disclosed herein, the present invention allows a chip-scale package to carry information to a user while having reduced damage due to sparking from electrostatic charging.

DETAILED DESCRIPTION OF THE INVENTION

The present invention relates to an improvement in chip-scale packages. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

Figure 1:
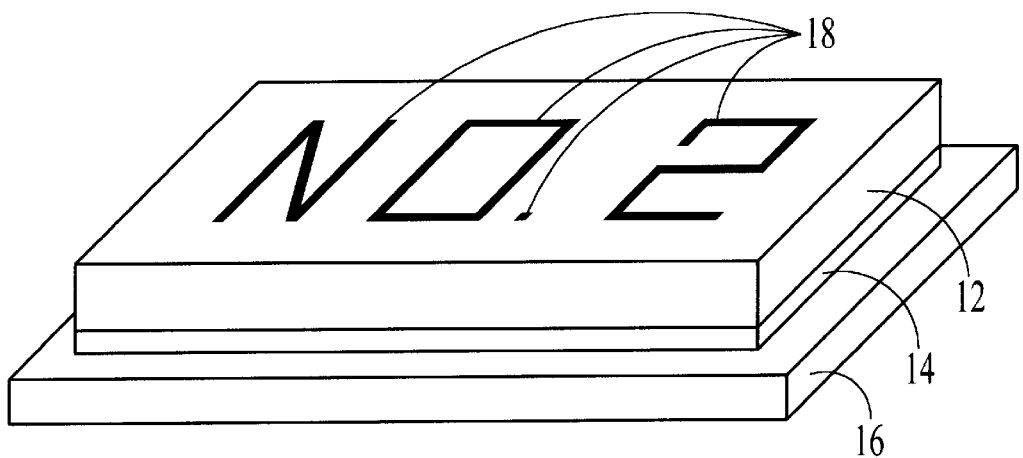
FIG. 1 is a diagram of a conventional marked chip-scale package.

FIG. 1 is a block diagram of a conventional chip-scale package 10. The conventional chip-scale package 10 includes a semiconductor die 12 having and a substrate 16. The semiconductor die 12 has an active 14 on which circuitry is fabricated. The semiconductor die 12 also has an exposed surface on which markings 18 are made. The conventional markings 18 are typically made by using a laser (not shown) to cut a groove in the surface of the semiconductor die 12. Consequently, information such as part number and manufacturer can be carried on the chip-scale package 10.

The conventional chip-scale package 10 is subject to electrostatic charging. As a result, when contact is made to the conventional chip-scale package 10, a spark may be generated. The spark may pass through a substantial portion of the semiconductor die 12, causing damage to circuits in the active area 14. Thus, failures in the chip-scale package 10 are induced.

Figure 2:
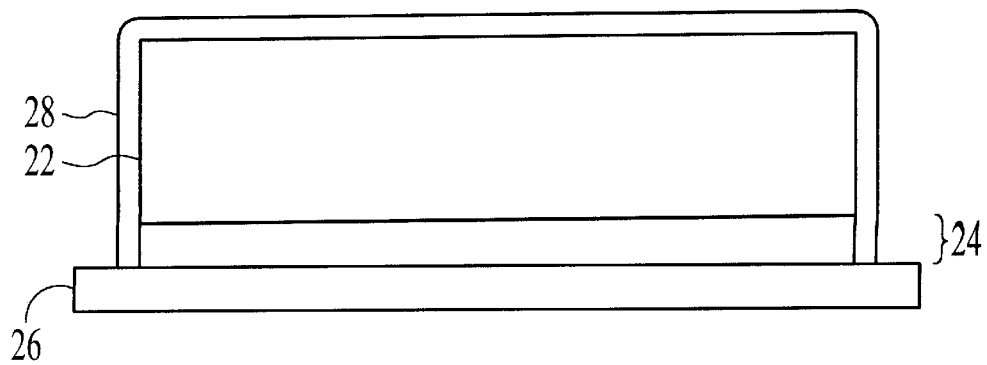
FIG. 2 is a diagram of a chip-scale package having an electrophoretic coating.

FIG. 2 depicts a chip-scale package 20 having a thin insulating, highly resistive coating 28. The chip-scale package 20 includes a semiconductor die 22 having an active area 24. The semiconductor die 22 is affixed to a substrate 26. The coating 28 is preferably an electrophoretic coating. The coating may be on the order of twenty to thirty microns thick. The coating 28 is thin in part to ensure that the size of the chip-scale package 20 remains small. Because of the coating 28, electrostatic charging and damage due to sparking are reduced. Consequently, the chip-scale package 20 is more reliable.

Figure 3A:
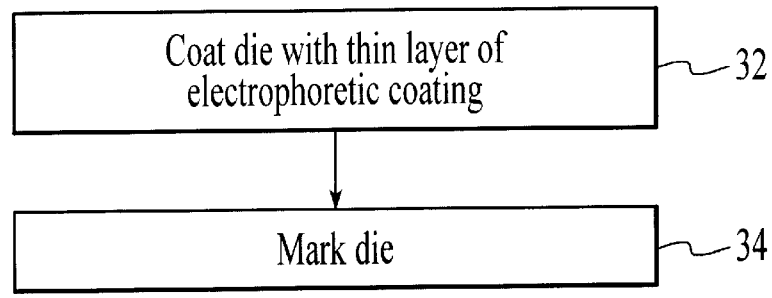
FIG. 3A is a flow chart depicting a conventional method for marking a chip-scale package having an electrophoretic coating.

It is desirable to mark the semiconductor die 22 of the chip-scale package 20 in order to carry information. FIG. 3A depicts a conventional method for marking the chip-scale package 20 having a thin insulating coating 28. The coating 28 for the chip-scale package 20 is applied via step 32. The chip-scale package 20 is then marked via step 34. In order to mark the chip-scale package 20, a laser is typically used to burn a groove into the chip-scale package 20. Note that other methods of marking the chip-scale package 20, such as inking the chip-scale package 20, may not function because the ink characters (not shown) cannot be formed with sufficient resolution to carry the desired amount of information on the chip-scale package 20.

Although a laser can mark the chip-scale package 20 with sufficient resolution, one of ordinary skill in the art will realize that marking the chip-scale package 20 not only removes the benefits of the coating 28, but may also damage the active area 24 of the chip-scale package 20.

Figure 3B:
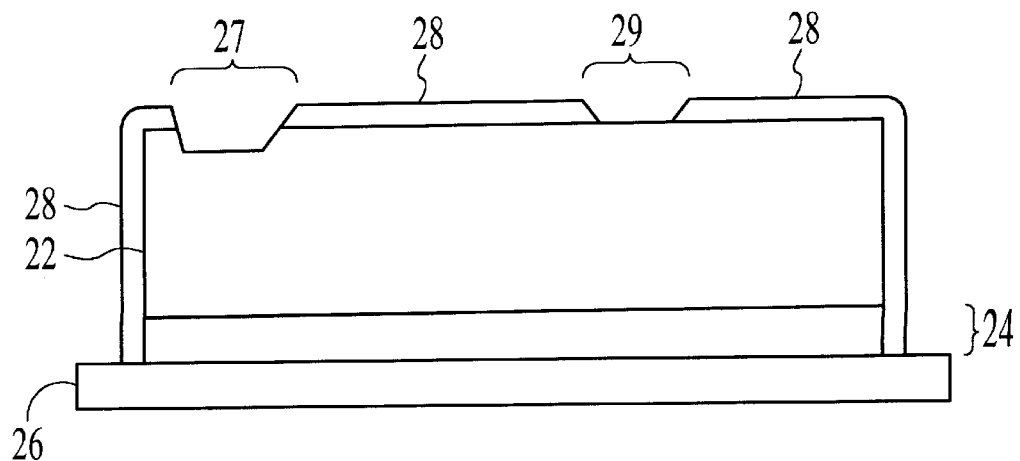
FIG. 3B is a diagram of a chip-scale package having an electrophoretic coating marked using a conventional method.

For example, FIG. 3B is a diagram of the chip-scale package 20 after conventional laser marking has been performed. The laser marking penetrated the coating 28 in areas 27 and 29. This occurs because typical laser marking penetrates to a depth on the order of one hundred microns. The coating 28 is, however, on the order of twenty to thirty microns. Because portions of the coating 28 have been eroded, the coating 28 is no longer able to protect the semiconductor die 22 from sparks generated due to electrostatic charge. Thus, the benefits gained by applying the coating in step 32 of the method 30 are lost by marking the semiconductor die 22 in step 34 of the method 30. Moreover, conventional marking performed in the absence of the coating 28 may cause damage to the active area 24. This occurs because the energy of the laser may penetrate relatively deeply into the semiconductor die 22. Thus, the chip-scale package 20 is also subject to the same type of damage which may occur in the chip-scale package 10 without the coating 28.

The present invention provides a method and system for marking a chip-scale package. In one aspect, the chip-scale package includes a semiconductor die. The semiconductor die has an exposed portion substantially surrounded by the first coating. In this aspect, the method and system comprise applying a second coating to a first portion of the first coating and marking the second coating. The first coating is not completely penetrated by the marking. In a second aspect, the method and system comprise providing a chip-scale package. In this aspect, the method and system comprise providing a substrate, providing a semiconductor die coupled to a substrate, and providing a first coating. The semiconductor die has an exposed portion. The exposed portion is substantially surrounded by the first coating. In this aspect, the method and system further comprise providing a second coating substantially covering a first portion of the first coating. The second coating has a plurality of markings therein. The first coating is not completely penetrated by the plurality of markings.

Because the marking does not penetrate the first coating, the benefits of the first coating are preserved. Thus, where the first coating is a highly resistive, insulating coating, damage to due sparking of electrostatic charge is reduced. At the same time, the chip-scale package in accordance with the present invention can be marked to carry information useful to the user or manufacturer.

The present invention will be described in terms of a chip-scale package using particular coatings. However, one of ordinary skill in the art will readily recognize that this method and system will operate effectively for other types of coatings and other packages.

Figure 4:
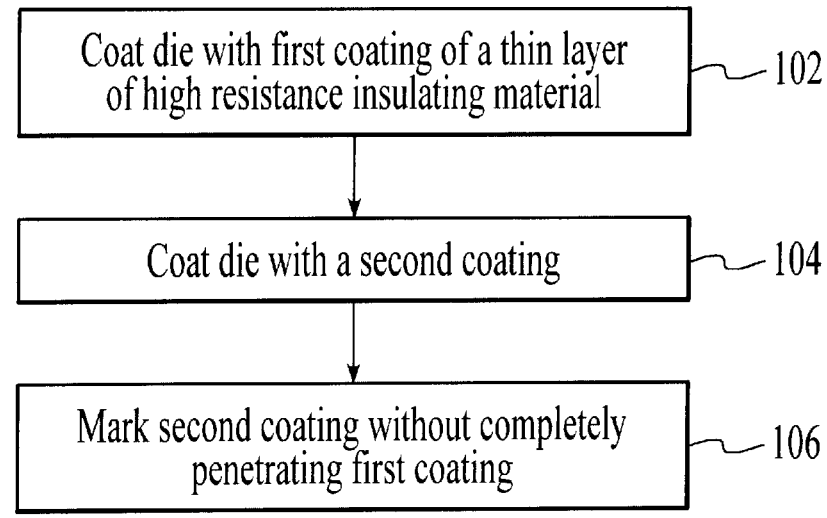
FIG. 4 is a flow chart depicting one embodiment of a method in accordance with the present invention for marking a chip-scale package having an electrophoretic coating.

To more particularly illustrate the method and system in accordance with the present invention, refer now to FIG. 4 depicting a flow chart of one embodiment of a method 100 in accordance with the present invention. The semiconductor die is coated with a first coating via step 102. The first coating is a thin, high resistance, insulating coating. A second coating is then applied, via step 104. Preferably, the second coating substantially covers the first coating. In one embodiment, the second coating is a tape. In this embodiment, step 104 is performed by affixing a tape to the semiconductor die. Because the tape adheres to the semiconductor die, the tape (the second coating) becomes an integral part of the chip-scale package. In one embodiment, the tape is on the order of 20 microns thick. Thus, step 104 is performed by applying several layers of tape to form the second coating. In a preferred embodiment, step 104 is performed by spraying or spinning the second coating onto the semiconductor die. Preferably, the second coating, even if made of many individual layers, is a total of approximately one hundred microns thick. The second coating is then marked without completely penetrating the first coating, via step 106.

Figure 5:
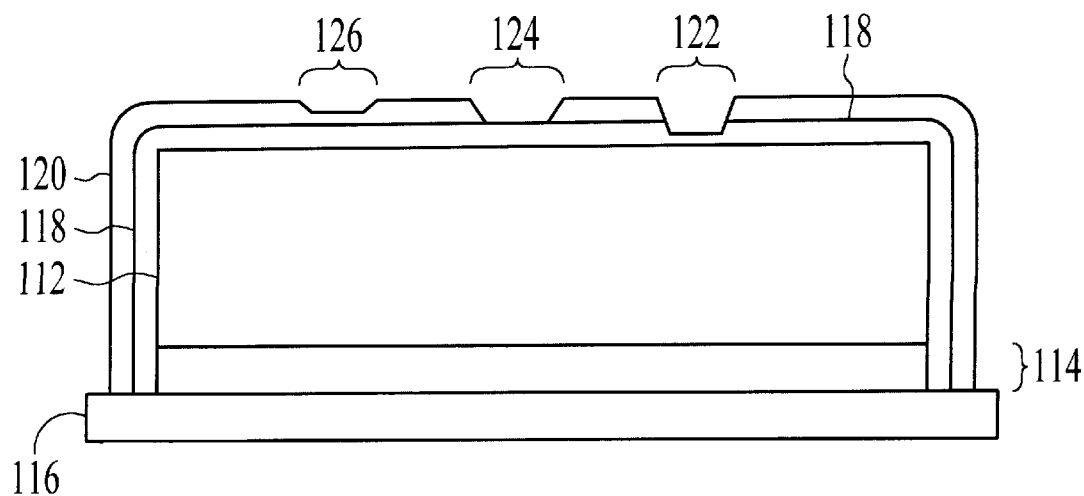
FIG. 5 is a diagram of one embodiment of a chip-scale package marked in accordance with the present invention.

FIG. 5 depicts one embodiment of a chip-scale package 110 fabricated and marked in accordance with the present invention. The chip-scale package 110 includes a semiconductor die 112 having an active surface 114. The chip-scale package 110 also includes a substrate 116 to which the semiconductor die is affixed and a thin, high resistivity insulating coating 118. Thus, the first coating is the coating 118. The chip-scale package 110 also includes a second coating 120. Because of the marking carried out in step 106, the second coating 120 includes grooves 122, 124, and 126. The grooves 122, 124, and 126 are part of the markings on the chip-scale package 110.

None of the grooves 122, 124, and 126 completely penetrate the first coating 118. The shallowest groove 124 does not penetrate the second coating. The groove 126 completely penetrates the second coating 118, without substantially affecting the surface of the first coating. The deepest groove 122 completely penetrates the second coating, but does not completely penetrate the first coating. Consequently, the chip-scale package 110 is marked and retains the benefits provided by the first coating 118. Thus, damage to the active area 114 is reduced and sufficient information may be imparted to the user.

Figure 6:
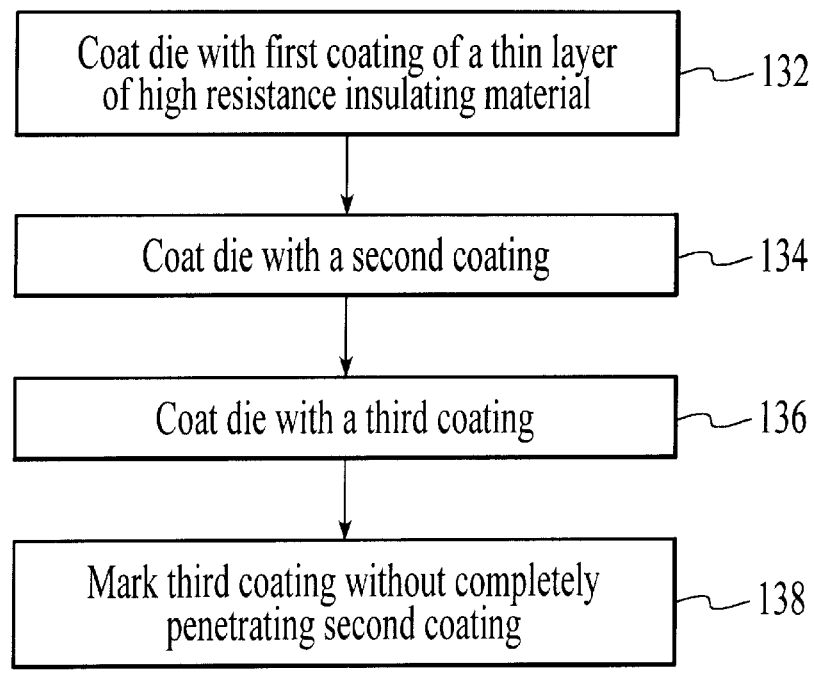
FIG. 6 is a flow chart depicting another embodiment of a method in accordance with the present invention for marking a chip-scale package having an electrophoretic coating.

FIG. 6 depicts a flow chart of another method 130 for marking a chip-scale package in accordance with the present invention. The semiconductor die is coated with a first coating via step 132. The first coating is a thin, high resistance, insulating coating. A second coating is then applied, via step 134. Preferably, the second coating substantially covers the first coating. A third coating is then applied, via step 136. The third coating preferably substantially covers the second coating. Also in a preferred embodiment, the third coating can be visually distinguished from the second coating. For example, the second coating might be dark colored, and the third coating might be light colored, such as a white molding compound. Step 134 and 136 may be performed in a similar manner to step 104 of the method 100. The third coating is also preferably on the order of one hundred microns thick. Referring back to FIG. 6, the die is then marked without completely penetrating the second coating, via step 138. Also in step 138, the third coating is preferably completely penetrated.

Figure 7:
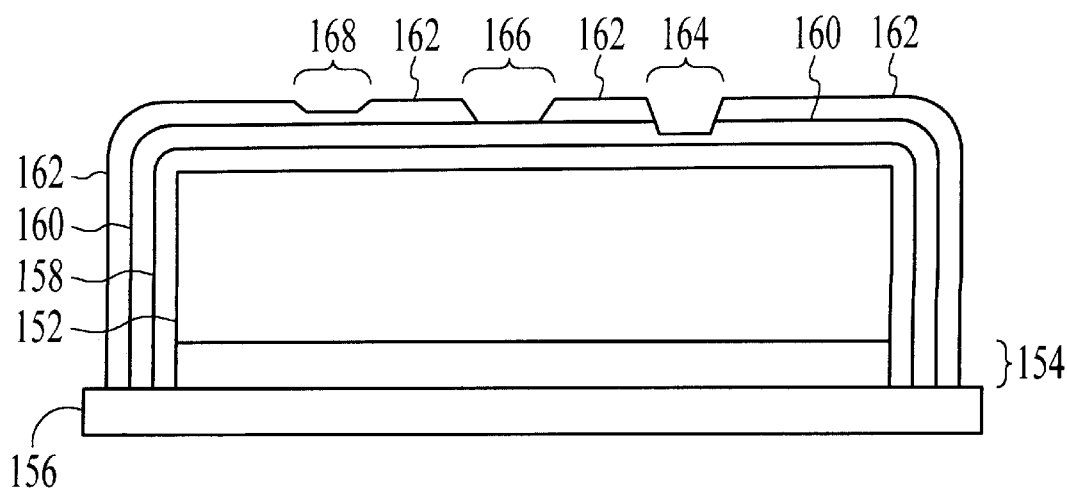
FIG. 7 is a diagram of another embodiment of a chip-scale package marked in accordance with the present invention.

FIG. 7 depicts one embodiment of a chip-scale package 150 fabricated and marked in accordance with the method 130. The chip-scale package 150 includes a semiconductor die 152 having an active surface 154. The chip-scale package 150 also includes a substrate 156 to which the semiconductor die is affixed and a thin, high resistivity insulating coating 158. Thus, the first coating is the coating 158. The chip-scale package 110 also includes a second coating 160 and a third coating 162. Because of the marking carried out in step 138, the third coating 120 includes grooves 164, 166, and 186. The grooves 164, 166, and 168 are part of the markings on the chip-scale package 150.

None of the grooves 164, 166, and 168 completely penetrate the first coating 158 or the second coating 160. The shallowest groove 124 does not penetrate the second coating. Although not necessary, it is preferable for all of the grooves 164, 166, and 168 to penetrate the third coating. Because the second coating 160 and the third coating 162 have different color, the markings composed of the grooves 164, 166, and 168 is relatively easy to see. In addition, because the first coating 158 is not penetrated, the chip-scale packages still retain the benefits of the electrophoretic coating.

Thus, the chip-scale packages 110 and 150 carry sufficient information in their markings 122, 124, and 126, and 164, 166, and 168, respectively. In addition, the marking steps 106 and 138 are performed without completely penetrating the first coating 118 and 158, respectively. As a result, damage due to sparking because of electrostatic charging is reduced. Thus, reliability of the chip-scale packages is enhanced while the chip-scale packages are capable of carrying information for the user on the markings.

A method and system has been disclosed for marking a chip-scale package in accordance with the present invention.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A chip-scale package comprising:
   a substrate;
   a semiconductor die coupled to the substrate, the semiconductor die having an exposed portion;
   a first coating, the exposed portion being substantially surrounded by the first coating;
   a second coating substantially covering a first portion of the first coating, the first coating remaining intact at least until the second coating is provided; and
   a third coating substantially covering a second portion of the second coating, the second coating being disposed between the first coating and the third coating, the third coating having a plurality of markings therein;
   wherein at least a portion of the first coating is not completely penetrated by the plurality of markings and
   wherein the second coating is not completely penetrated by the plurality of markings.

2. The chip-scale package of claim 1 wherein the first coating further includes an electrophoretic coating.

3. The chip-scale package of claim 1 wherein the second coating is a tape adhered to the first portion of the first coating.

4. The chip-scale package of claim 1 wherein the second coating is a molding compound.

5. The chip-scale package of claim 1 wherein the second coating is at least one hundred microns thick.

6. The chip-scale package of claim 1 wherein the combination of the second coating and the third coating is at least one hundred microns thick.

7. The chip-scale package of claim 1 wherein the second coating remains intact at least until the plurality of markings are provided.

8. The chip-scale package of claim 1 wherein the third coating remains intact at least until the plurality of markings are provided.

9. A method for marking a chip-scale package, the chip-scale package including a semiconductor die and a substrate, the semiconductor die having an exposed portion, the exposed portion being substantially surrounded by the first coating, the method comprising the steps of:
   (a) applying a second coating to a first portion of the first coating, the second coating substantially covering a first portion of the first coating, the first coating remaining intact at least until the second coating is provided; and
   (b) applying a third coating substantially covering a second portion of the second coating, the second coating being disposed between the first coating and the third coating, the third coating having a plurality of markings therein;
   (c) marking the third coating such that the second coating is not completely penetrated;
   wherein the first coating is not completely penetrated by the marking.

10. The method of claim 9 wherein the first coating is an electrophoretic coating.

11. The method of claim 9 wherein the second coating applying step (a) further includes the step of:
   (a1) adhering a tape to the first portion of the first coating.

12. The method of claim 11 wherein the marking step (c) further includes the step of:
   (c1) marking the third coating using a laser.

13. The method of claim 9 wherein the second coating applying step (a) furter includes the step of:
   (a1) applying a molding compound to the first portion of the first coating.

* * * * *